United States Patent
Lin et al.

(10) Patent No.: US 8,552,687 B2
(45) Date of Patent: Oct. 8, 2013

(54) METHOD AND SYSTEM FOR CHARACTERIZING A BATTERY

(75) Inventors: Jian Lin, Beverly Hills, MI (US); Xidong Tang, Sterling Heights, MI (US); Xiaodong Zhang, Mason, OH (US); Brian J. Koch, Berkley, MI (US); Damon R. Frisch, Troy, MI (US); Wei Liu, Warren, MI (US); Michael J. Gielniak, Atlanta, GA (US)

(73) Assignee: GM Global Technology Operations LLC, Detroit, MI (US)

( * ) Notice: Subject to any disclaimer, the term of this patent is extended or adjusted under 35 U.S.C. 154(b) by 932 days.

(21) Appl. No.: 12/134,032

(22) Filed: Jun. 5, 2008

(65) Prior Publication Data

US 2009/0302855 A1    Dec. 10, 2009

(51) Int. Cl.
*H02J 7/00*    (2006.01)
(52) U.S. Cl.
USPC ............................ 320/132; 320/166; 320/167
(58) Field of Classification Search
USPC .......................................... 320/132, 166, 167
See application file for complete search history.

(56) References Cited

U.S. PATENT DOCUMENTS

| | | | | |
|---|---|---|---|---|
| 2003/0184307 A1* | 10/2003 | Kozlowski et al. | ........... | 324/427 |
| 2005/0057255 A1* | 3/2005 | Tate et al. | ..................... | 324/426 |
| 2006/0055373 A1* | 3/2006 | Bopp et al. | ................... | 320/132 |
| 2006/0284617 A1* | 12/2006 | Kozlowski et al. | ........... | 324/426 |
| 2008/0054848 A1* | 3/2008 | Yun et al. | ..................... | 320/134 |

OTHER PUBLICATIONS

"PNGV Battery Test Manual", Rev.3, Feb. 2001.*
(NanoPhosphate Lithium Ion) "UnderstandingNano.com" Press Release, May 16, 2007.*
"PNGV Battery Test Manual", Rev.3, Feb. 2001 (See Attached).*
PNGV Battery Test Manual, Rev.3, Feb. 2001 (See Attached).*
M. Verbrugge, D. Frisch, and B. Koch, "Adaptive Energy Management of Electric and Hybrid Electric Vehicles," Journal of the Electrochemical Society, Dec. 23, 2004, vol. 152, No. 2, pp. A333-A342.

* cited by examiner

*Primary Examiner* — Jermele M Hollington
*Assistant Examiner* — Temilade S Rhodes-Vivour
(74) *Attorney, Agent, or Firm* — Ingrassia Fisher & Lorenz, P.C.

(57) ABSTRACT

Methods and systems are provided for characterizing a battery. A property of the battery is measured. A dynamic characteristic of the battery is determined from a second order linear dynamic model.

19 Claims, 4 Drawing Sheets

METHOD AND SYSTEM FOR CHARACTERIZING A BATTERY

TECHNICAL FIELD

The present invention generally relates to electrochemical power sources, such as batteries, and more particularly relates to a method and system for characterizing a battery, and even more particularly relates to a method and system for determining the state of charge of a battery.

BACKGROUND OF THE INVENTION

In recent years, advances in technology, as well as ever-evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles often use electrochemical power sources, such as batteries, ultracapacitors, and fuel cells, to power the electric motors that drive the wheels, sometimes in addition to another power source, such as an internal combustion engine. An important parameter in the operation of vehicles that utilize batteries is the "state of charge" (SOC). The state of charge refers to the stored energy in the battery that is available to be used at any given time relative to the stored energy that is available when the battery is fully charged. An accurate determination of the state of charge allows for the vehicles to maximize performance and efficiency while minimizing emissions.

A conventional approach for batteries is to relate either a measured or calculated open circuit voltage to the state of charge. This is feasible because the open circuit voltage, which is the resting voltage of the battery when no load is applied, generally exhibits some observable dependence on the battery's state of charge. There are batteries, however, such as nickel metal hydride and some types of lithium ion batteries (e.g., nanophosphate lithium ion batteries), which possess a nearly constant open circuit voltage across most of the range of state of charge. In other words, the open circuit voltage reveals nothing about the state of charge of the battery. For example, in some nanophosphate lithium ion batteries, increases in the state of charge from 0% to 100% results in only a 7% change in the open circuit voltage.

Therefore, while these batteries are highly desirable as power sources for electric and hybrid vehicles because of their low mass, high power capability, and large energy storage capacity, they present a problem with regard to control because it is very difficult to estimate their state of charge with any degree of certainty.

Accordingly, it is desirable to provide a method and a system for determining the state of charge of a battery that is not based on its open circuit voltage. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method for characterizing a battery is provided. A property of the battery is measured. A dynamic characteristic of the battery is determined from a second order linear dynamic model.

A method for determining a state of charge of a nanophosphate lithium ion battery is provided. At least one property of the nanophosphate lithium ion battery is measured. A dynamic characteristic of the battery is determined from a second order linear dynamic model. The model is a function of the at least one measured property. The state of charge of the battery is determined based on the dynamic characteristic.

A method for determining a state of charge of a nanophosphate lithium ion battery is provided. A double layer capacitance of the nanophosphate lithium ion battery is determined. The state of charge of the battery is determined based on the double layer capacitance.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-9 are merely illustrative and may not be drawn to scale.

FIG. 1 to FIG. 9 illustrate methods and systems for characterizing a battery. A property (e.g., current, voltage, temperature, etc.) of a battery (e.g., a nanophosphate lithium ion battery) is measured. A dynamic characteristic of the battery (e.g., dominant or double layer capacitance) is determined from a second order linear dynamic model. The model is a function of the measured property. The state of charge of the battery is determined based on the dynamic characteristic.

Figure 1:
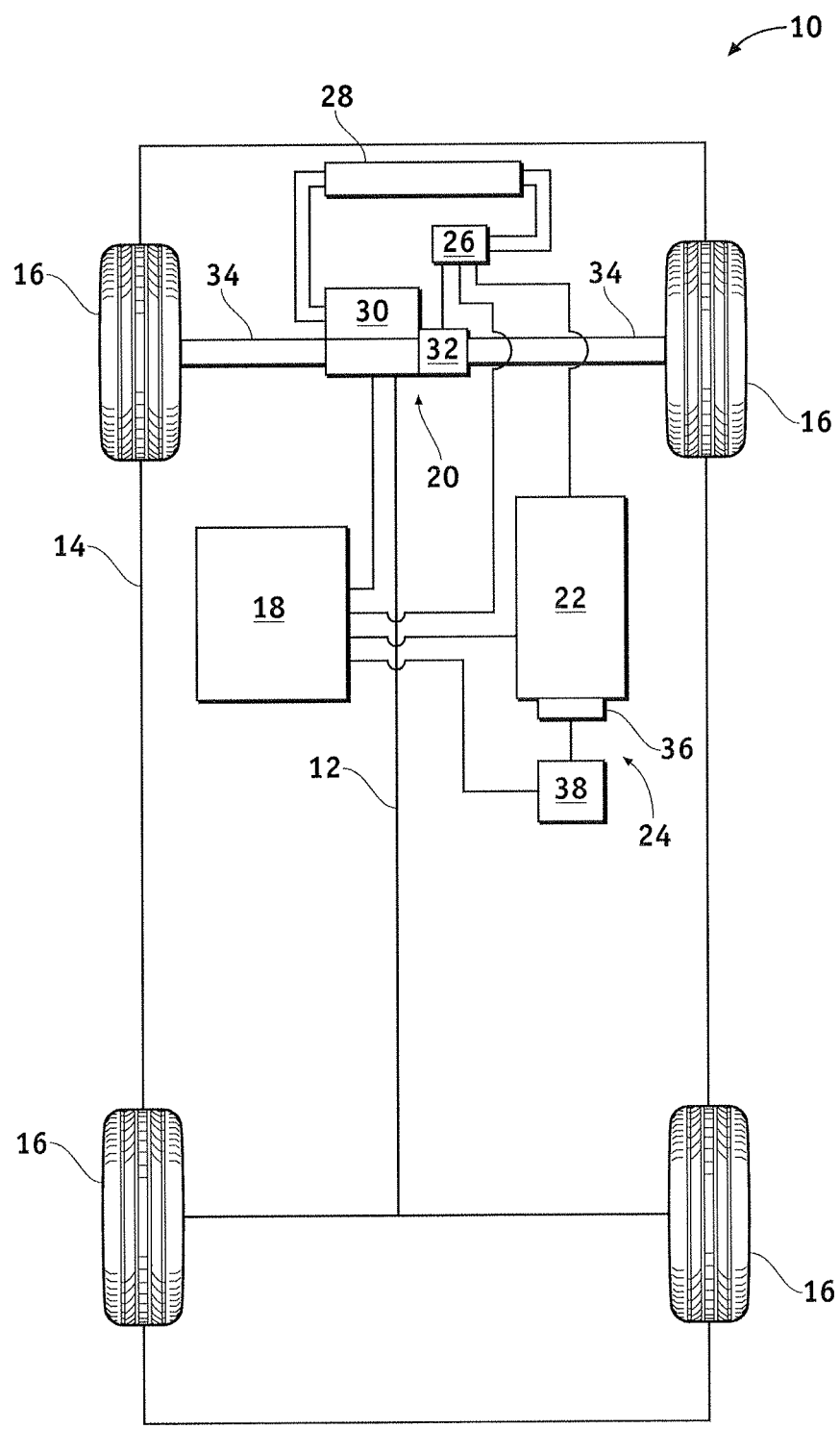
FIG. 1 is a schematic view of an exemplary automobile according to one embodiment of the present invention.

FIG. 1 illustrates a vehicle 10, or "automobile," according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid electric vehicle (HEV), and further includes an actuator assembly 20, a battery 22, a state of charge (SOC) system 24, a power inverter assembly (or inverter) 26, and a radiator 28. The actuator assembly 20 includes a combustion engine 30 and an electric motor/generator (or motor) 32. As will be appreciated by one skilled in the art, the electric motor 32 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 32 may include multiple electromagnetic poles (e.g., sixteen poles), as is commonly understood.

Still referring to FIG. 1, and as described in greater detail below, the combustion engine 30 and the electric motor 32 are integrated such that one or both are mechanically coupled to at least some of the wheels 16 through one or more drive shafts 34. In one embodiment, the automobile 10 is a "series HEV," in which the combustion engine 30 is not directly coupled to the transmission, but coupled to a generator (not shown), which is used to power the electric motor 32. In another embodiment, the automobile 10 is a "parallel HEV," in which the combustion engine 30 is directly coupled to the transmission by, for example, having the rotor of the electric motor 32 rotationally coupled to the drive shaft of the combustion engine 30.

The battery 22 is electrically connected to the inverter 26 and, in one embodiment, is a nanophosphate lithium ion (Li-ion) battery including a plurality of cells, as is commonly understood. It should be understood, however, that other embodiments may utilize the systems and methods described below on other types of batteries, including other types of Li-ion batteries.

The SOC system 24 includes a sensor array 36 and a SOC module 38. Although not shown in detail, the sensor array 36 includes a current sensor, a voltage sensor, and a temperature sensor located adjacent to the battery 22 (or more particularly within the battery/inverter circuit shown in FIG. 2). The SOC module 38 is in operable communication with the sensor array 36 and in one embodiment includes at least one processor and/or a memory that includes data relating measured properties of the battery 22 to the state of charge of the battery 22, as is described in greater detail below. Although not illustrated as such, the SOC module 38 may be integral with the electronic control system 18 and may also include one or more power sources.

The radiator 28 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 30 and the inverter 26.

Figure 2:
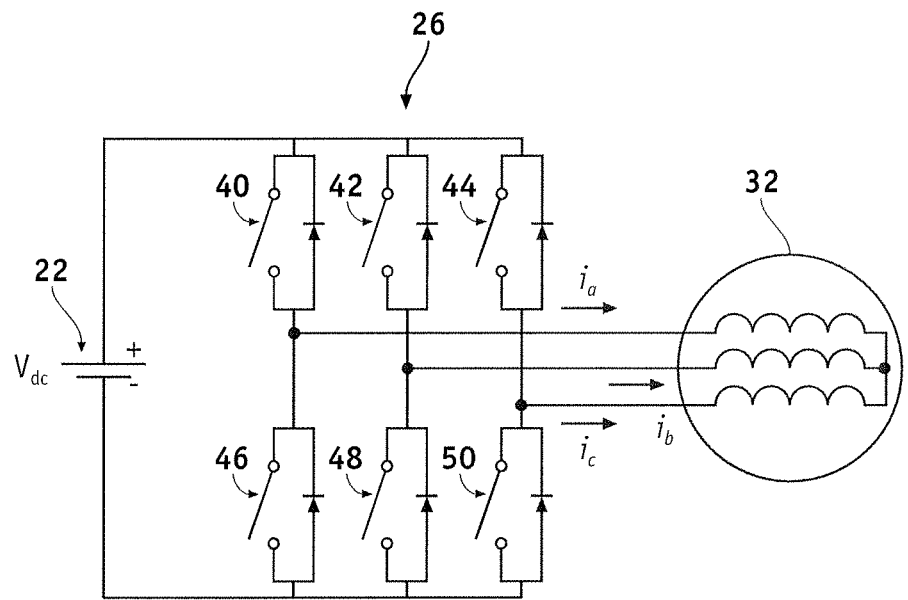
FIG. 2 is a schematic view of an inverter within the automobile of FIG. 1.

FIG. 2 illustrates the inverter 26 in greater detail. The inverter 26 includes a three-phase circuit coupled to the motor 32. More specifically, the inverter 26 includes a switch network having a first input coupled to a voltage source $V_{dc}$ (e.g., the battery 22) and an output coupled to the motor 32. Although a single voltage source is shown, a distributed direct current (DC) link with two series sources may be used. The switch network comprises three pairs (a, b, and c) of series switches with antiparallel diodes (i.e., antiparallel to each switch) corresponding to each of the phases of the motor 32. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and having a first terminal coupled to a second terminal of the respective first switch 40, 42, and 44.

Referring again to FIG. 1, the electronic control system 18 is in operable communication with the actuator assembly 20, the battery 22, the SOC system 24, and the inverter 26. Although not shown in detail, the electronic control system 18 includes various sensors and automotive control modules, or electronic control units (ECUs), such as a body control module (BCM), and at least one processor and/or a memory which includes instructions stored thereon (or in another computer-readable medium) for carrying out the processes and methods as described below.

During operation, still referring to FIG. 1, the automobile 10 is operated by providing power to the wheels 16 with the combustion engine 30 and the electric motor 32 in an alternating manner and/or with the combustion engine 30 and the electric motor 32 simultaneously. In order to power the electric motor assembly 30, DC power is provided from the battery 22 to the inverter 26, which converts the DC power to AC power, prior to energizing the electric motor 32.

According to one aspect of the present invention, a method to determine the state of charge of the nanophosphate lithium ion battery 22 based on battery dynamic characteristics is provided. Embodiments of the invention may involve multiple phases. First, a proper dynamic model for a nanophosphate lithium ion battery is derived and verified through experimental data. Second, the experimental data is used to identify which characteristics of the battery are suitable to infer the state of charge of the battery. Third, an algorithm is used on-board the automobile to estimate the battery dynamic characteristics using vehicle data and infer the state of charge of the battery.

Figure 3:
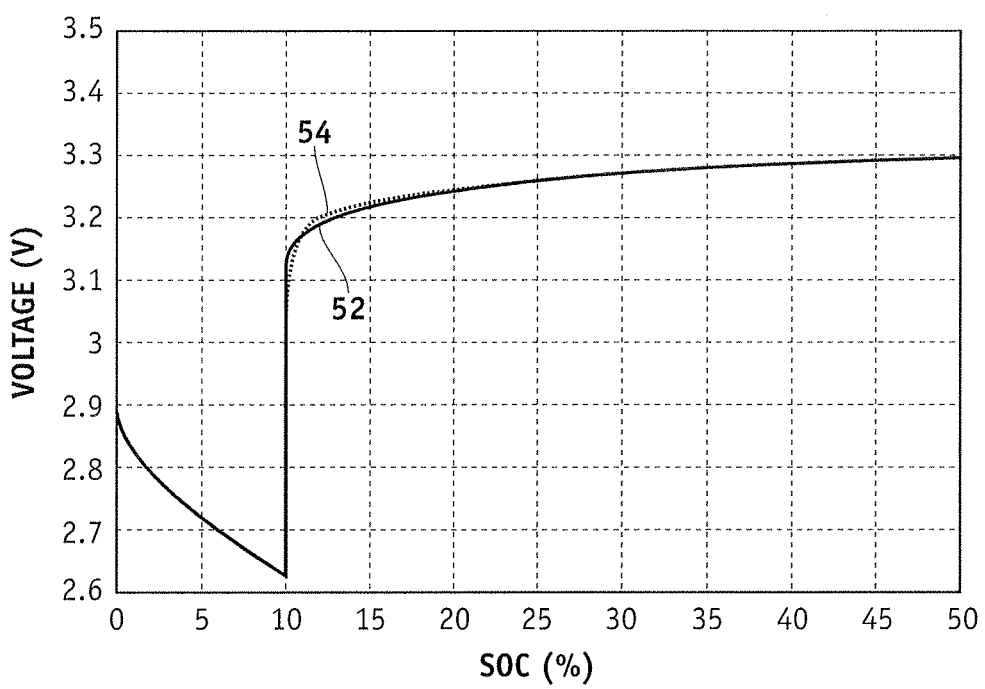
FIG. 3 is a graph useful for comparing measured terminal voltages of a battery at various states of charge (SOC) to a dynamic model.

In one exemplary embodiment, hybrid pulse power characterization (HPPC) test were conducted on a nanophosphate lithium ion battery in a laboratory at various temperatures and states of charge. FIG. 3 illustrates the results of one such test, which was performed with the battery at a state of charge of 80%. The battery was discharged for approximately 10 seconds (x-axis) and the voltage (y-axis), as measured at the terminals of the battery, was recorded. The recorded battery voltage is indicated with line 52.

The resultant data was then compared to several known, dynamic models. Line 54 in FIG. 3 represents the behavior a second order linear dynamic model, as is commonly understood. As clearly shown in FIG. 3, the second order linear dynamic model accurately mimics the behavior of the battery with respect to voltage at 80% state of charge. Although not specifically shown, other tests were performed and the same was found to be true at various other states of charge between 10% and 90%. That is, the second order linear dynamic model exhibits similar electrical properties as the nanophosphate lithium ion battery over a wide range of states of charge. As such, in one embodiment, the second order linear dynamic model is used to predict the behavior of the nanophosphate lithium ion battery.

It should be noted that although not specifically described, tests similar to that depicted in FIG. 3 may be conducted on the battery 22 during battery charging. As will be appreciated by one skilled in the art, a graph similar to that shown in FIG. 3 for charge cycles may appear very similar, but be a "mirror image" in the horizontal directions. As such, the second order linear dynamic model, as well as the equations discussed below, may also be used to model the battery 22 during periods of charge.

Figure 4:
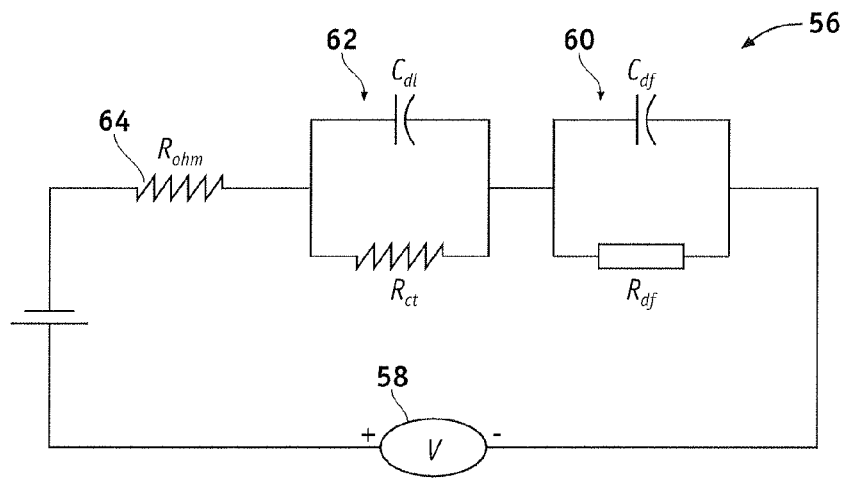
FIG. 4 is a schematic view of a second order linear dynamic model of a battery.
Figure 5:
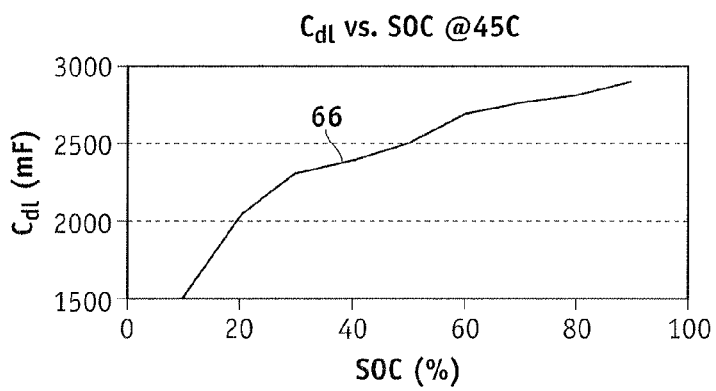
FIGS. 5-8 are graphs comparing double layer capacitance to a SOC of the battery for various temperatures.

FIG. 4 illustrates a simplified circuit (or battery) 56 that observes the second order linear dynamic behavior. The circuit 56 includes a voltage (or power) source 58, resistor-capacitor (RC) pairs 60 and 62, and a resistor 64. As will be appreciated by one skilled in the art, measured battery terminal voltage (V(k)) of a battery that follows second order linear dynamic behavior may be expressed $$V(k)=V_{oc}+I(k)R+V_{dl}(k)+V_{df}(k), \quad (1)$$

where k is the sample number, I(k) is the measured battery terminal current, $V_{oc}$ is the open-circuit voltage, R is the Ohmic resistance, and $V_{dl}(k)$ and $V_{df}(k)$ (voltages across the two RC pairs 60 and 62) are double layer voltage and diffusion voltage, respectively. The double layer voltage $V_{dl}$ may be further dynamically described by the expression $$V_{dl}(k) = \exp\left(-\frac{\Delta t}{R_{ct}C_{dl}}\right)V_{dl}(k-1) + R_{ct}\left(1 - \exp\left(-\frac{\Delta t}{R_{ct}C_{dl}}\right)\right)I(k-1), \quad (2)$$

and similarly the diffusion voltage $V_{df}$ may be dynamically described by $$V_{df}(k) = \exp\left(-\frac{\Delta t}{R_{df}C_{df}}\right)V_{df}(k-1) + R_{df}\left(1 - \exp\left(-\frac{\Delta t}{R_{df}C_{df}}\right)\right)I(k-1), \quad (3)$$

where $R_{ct}$ is the charge transfer resistance, $C_{dl}$ is the double layer capacitance, $R_{df}$ is the diffusion resistance, and $C_{df}$ is the diffusion capacitance.

Data collected, for example, during the HPPC tests, such as currents, voltages, and temperatures of the battery, were then used, in combination with the equations described above, to identify which characteristics of the battery are suitable for inferring the state of charge of the battery. That is, the data collected for different state of charge levels are used to extract the dynamic characteristics from the battery model with suitable monotonicity and sensitivity. In general, it is preferable for a state of charge indicator to have a monotonic relation with state of charge (e.g., only increase as the state of charge is increased) and be sensitive enough to changes in state of charge such that changes in state of charge may be easily detected. A state of charge indicator is preferably also robust to variations in temperature and battery type.

In one embodiment, for the nanophosphate lithium ion battery, one of the dominant capacitance of the two capacitances ($C_{dl}$ and $C_{df}$) extracted from the second order model, which may be referred to as "double layer capacitance" ($C_{dl}$), as is commonly understood, is chosen as the index of the state of charge. It should be understood, however, that other properties related to double layer capacitance may be used, such as charge transfer resistance ($R_{ct}$) or a time constant ($\tau$). As will be appreciated by one skilled in the art, the relationship between all three may be expressed simply as $$\tau=R_{ct}\times C_{dl} \quad (4)$$

Figure 6:
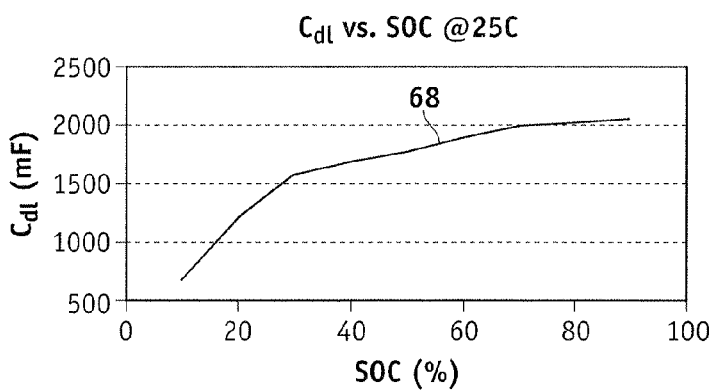
Figure 7:
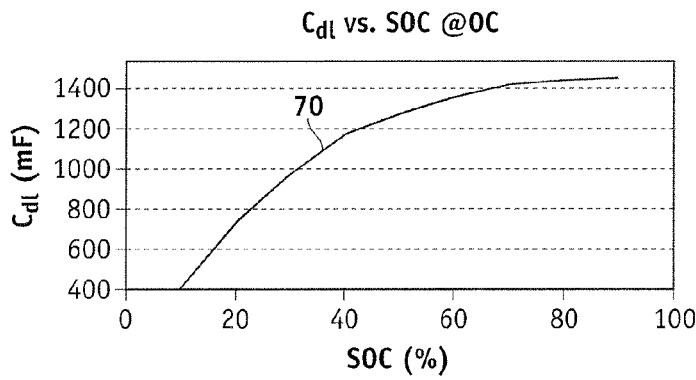
Figure 8:
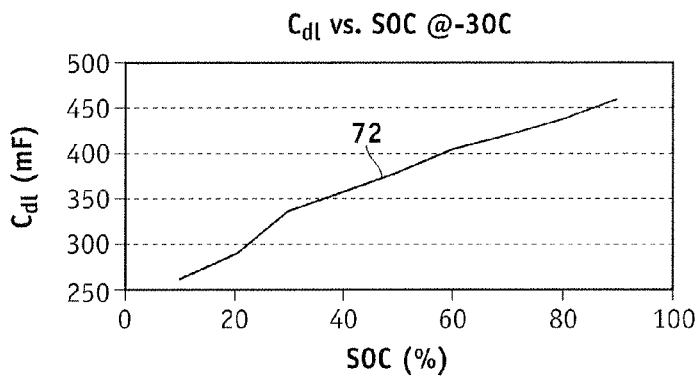

FIGS. 5-8 clearly demonstrate the benefits of the use of double layer capacitance as an indicator of the state of charge across a wide range of temperatures, particularly with respect to monotonicity and sensitivity. As shown by line 66 in FIG. 5, at 45° C., a change in state of charge from 0% to 100% causes the double layer capacitance to nearly double. Referring to FIG. 6, at 25° C., the same change in state of charge causes approximately a 300% increase in double layer capacitance, as indicated by line 68. Referring to lines 70 and 72 in FIGS. 7 and 8, at 0° C. and −30° C., the increase from 0% to 100% state of charge causes a 250% increase and a 70% increase, respectively, in the double layer capacitance. Information similar to that shown in FIGS. 5-8 is stored in the electronic control system 18 and/or the SOC module 38 in the form of, for example, look-ups and/or calculations.

Figure 9:
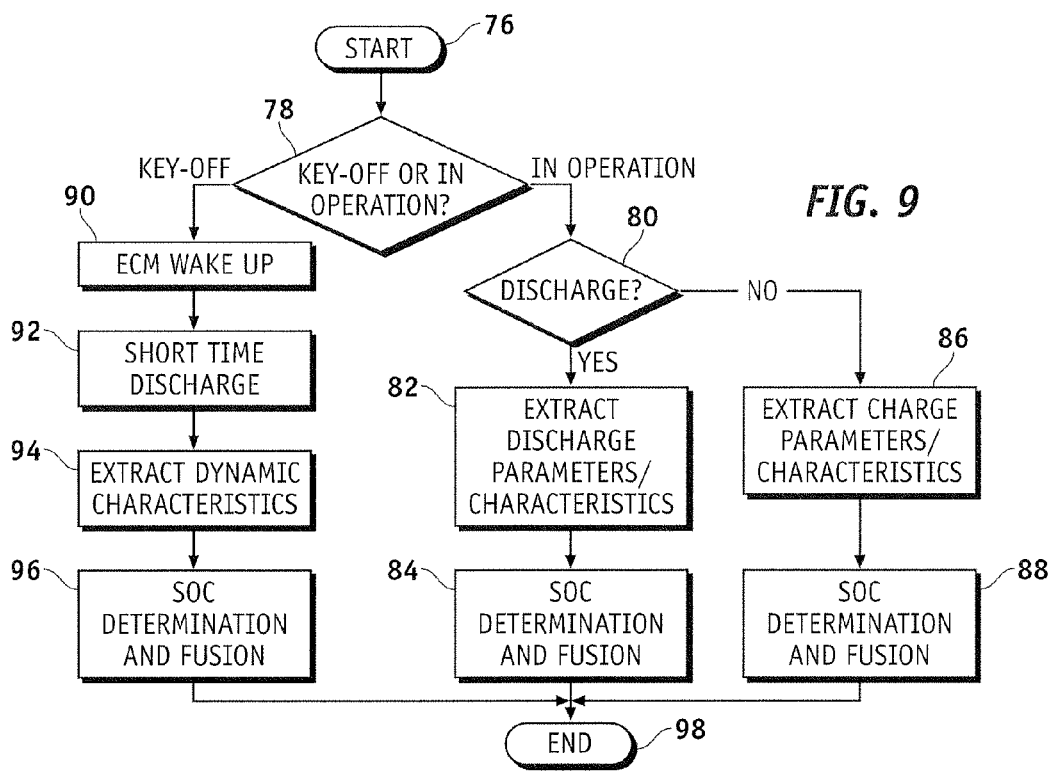
FIG. 9 is a flow chart of a method for determining the SOC of a battery according to one embodiment of the present invention.

FIG. 9 illustrates a method 74 for determining the state of charge of the battery 22, according to one embodiment of the present invention. At step 76, the methods begins, and at step 78, it is determined if the automobile is in operation. If the vehicle is in operation, the method 74 proceeds to step 80, where it is determined if the battery is currently in a state of discharge (as opposed to charge). If the battery is in a state of discharge, the method proceeds to step 82, at which point the appropriate battery properties (or characteristics), such as current, voltage, and temperature, are retrieved from the sensor array 36 (FIG. 1). The SOC is then determined from the battery properties at step 84. The actual state of charge determination may be made using a look-up (or look-up table) or an equation.

If the battery is not in a state of discharge (i.e., the battery is in a state of charge), the method 74 proceeds to step 86. At step 86, the appropriate battery properties are retrieved, and at step 88, the state of charge is determined based on the battery properties.

If the automobile is not in operation (i.e., "key-off), the method proceeds to step 90 from step 78, where the appropriate ECM is initiated (or "woken up"). At step 92, the battery is discharged, and the appropriate properties are retrieved at step 94. At step 96, the SOC is determined based on the retrieved properties. From steps 84, 88, and 96, the method proceeds to step 98, at which point the method 74 ends. The SOC module 38 may generate a signal representative of the state of charge of the battery 22 and send that signal to, for example, the electronic control system 18 to be used in power management of the automobile 10.

One advantage of the method and system described above is that because the state of charge of the battery is determined without using the open circuit voltage of the battery, the use of batteries with relatively invariant open circuit voltage, such as some nanophosphate lithium ion batteries, is facilitated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for characterizing a battery comprising:
    measuring a property of the battery;
    determining a dynamic characteristic generated by a second order linear dynamic model of the battery, wherein the model is a function of the measured property; and
    observing the dynamic characteristic by a circuit comprising two resistor-capacitor pairs in series, the voltage across one of the resistor-capacitance pair is a double layer voltage and the voltage across the other resistance-capacitance pair is a diffusion voltage.

2. The method of claim 1, further comprising determining a state of charge of the battery based on the dynamic characteristic.

3. The method of claim 2, wherein the measured property is a current, a voltage, a temperature, or a combination thereof.

4. The method of claim 3, wherein the dynamic characteristic of the battery is a double layer capacitance of the battery.

5. The method of claim 4, wherein the measuring of the property comprises conducting a Hybrid Pulse Power Characterization (HPPC) test on the battery.

6. The method of claim 5, wherein the determining of the dynamic characteristic comprises identifying the dynamic characteristic from results of the HPPC test.

7. The method of claim 4, wherein the battery is a lithium ion battery installed in an automobile and the measuring of the property is performed with a sensor onboard the automobile.

8. A method for determining a state of charge of a lithium ion battery comprising:
    measuring at least one property of the lithium ion battery;
    observing a dynamic characteristic determined from a second order linear dynamic model of the battery by a circuit comprising two resistor-capacitor pairs in series, the voltage across one of the resistor-capacitance pair is a double layer voltage and the voltage across the other resistance-capacitance pair is a diffusion voltage, wherein the model is a function of the at least one measured property; and
    determining the state of charge of the battery based on the dynamic characteristic.

9. The method of claim 8, wherein the measuring of the at least one property occurs during a discharge or a charge cycle of the battery.

10. The method of claim 9, wherein the dynamic characteristic is a double layer capacitance of the battery.

11. The method of claim 10, wherein the battery is an automotive battery onboard an automobile and the measuring of the at least one property is performed with at least one sensor onboard the automobile.

12. The method of claim 11, wherein the at least one measured property of the battery comprises a current, a voltage, a temperature, or a combination thereof.

13. The method of claim 12, further comprising:
    conducting a Hybrid Pulse Power Characterization (HPPC) test on the battery; and
    identifying the dynamic characteristic of the battery based on results of the HPPC test.

14. The method of claim 13, wherein the determining of the state of charge of the battery is not based on an open circuit voltage of the automotive battery.

15. A method for determining a state of charge of a lithium ion battery comprising:
    identifying the double layer capacitance of the battery as a dynamic characteristic of the battery from a second order linear dynamic model;
    determining a double layer capacitance of the lithium ion battery by a circuit comprising two resistor-capacitor pairs in series, the voltage across one of the resistor-capacitance pair is a double layer voltage and the voltage across the other resistance-capacitance pair is a diffusion voltage; and
    determining the state of charge of the battery based on the double layer capacitance.

16. The method of claim 15, wherein the determining of the double layer capacitance comprises measuring at least one property of the battery.

17. The method of claim 16, wherein the double layer capacitance of the battery is based on the at least one measured property of the battery.

18. The method of claim 17, wherein the at least one measured property is a current, a voltage, a temperature, or a combination thereof.

19. The method of claim 18, wherein the battery is an automotive battery onboard an automobile and the measuring of the at least one property is performed with at least one sensor onboard the automobile.

* * * * *